United States Patent
Zhang et al.

(10) Patent No.: US 10,406,537 B2
(45) Date of Patent: Sep. 10, 2019

(54) METHOD OF MAKING A NOZZLE

(71) Applicant: 3M INNOVATIVE PROPERTIES COMPANY, St. Paul, MN (US)

(72) Inventors: Jun-Ying Zhang, Perrysburg, OH (US); Michael R. Gorman, Lake Elmo, MN (US); Haiyan Zhang, Woodbury, MN (US); Raymond P. Johnston, Lake Elmo, MN (US); Barry S. Carpenter, Oakdale, MN (US); John C. Clark, Maplewood, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 865 days.

(21) Appl. No.: 14/354,669

(22) PCT Filed: Nov. 1, 2012

(86) PCT No.: PCT/US2012/063066
§ 371 (c)(1),
(2) Date: Apr. 28, 2014

(87) PCT Pub. No.: WO2013/067184
PCT Pub. Date: May 10, 2013

(65) Prior Publication Data
US 2014/0283365 A1    Sep. 25, 2014

Related U.S. Application Data

(60) Provisional application No. 61/554,561, filed on Nov. 2, 2011.

(51) Int. Cl.
*B05B 1/14*    (2006.01)
*B23P 15/16*    (2006.01)
(Continued)

(52) U.S. Cl.
CPC .............. *B05B 1/14* (2013.01); *B23P 15/16* (2013.01); *B81C 99/0085* (2013.01);
(Continued)

(58) Field of Classification Search
CPC ... B23P 15/16; F02M 61/1833; F02M 61/168; F02M 61/184; F02M 2200/8069; Y10T 29/49432; Y10T 29/49433
See application file for complete search history.

(56) References Cited

U.S. PATENT DOCUMENTS 5,069,403 A    12/1991    Marentic
5,127,156 A    7/1992    Yokoyama
(Continued)

FOREIGN PATENT DOCUMENTS

CN    102205639    10/2011
JP    59091016 A2    5/1984
(Continued)

OTHER PUBLICATIONS

Clarke, "Laser Micro-Drilling Applications", Advanced Laser Applications Conference and Exposition (ALAC) 94-100 (2004).
(Continued)

*Primary Examiner* — Sarang Afzali
(74) *Attorney, Agent, or Firm* — Harold C. Knecht III (57) ABSTRACT

A method of fabricating a nozzle that includes casting and curing a first material using a patterned nip roller to form a first microstructured pattern of discrete microstructures, deforming at least one of the discrete microstructures; replicating the first microstructured pattern, including the at least one deformed discrete microstructure, in a second material different than the first material to make a replicated structure comprising a plurality of blind holes formed in the second material, removing second material of the replicated structure to expose tops of microstructures in the first
(Continued)

microstructured pattern, and removing the first material from the replicated structure, resulting in a nozzle having a plurality of through-holes in the second material and corresponding to the first microstructured pattern.

13 Claims, 6 Drawing Sheets

(51) Int. Cl.
  *B81C 99/00* (2010.01)
  *F02M 61/16* (2006.01)
  *F02M 61/18* (2006.01)

(52) U.S. Cl.
  CPC . *B81B 2203/0353* (2013.01); *B81C 2201/034* (2013.01); *F02M 61/168* (2013.01); *F02M 61/184* (2013.01); *F02M 61/1833* (2013.01); *F02M 2200/8069* (2013.01); *Y10T 29/4998* (2015.01); *Y10T 29/49432* (2015.01); *Y10T 29/49433* (2015.01)

(56) References Cited

U.S. PATENT DOCUMENTS

| | | | |
|---|---|---|---|
| 5,133,516 A | 7/1992 | Marentic | |
| 5,453,104 A | 9/1995 | Schwabel | |
| 5,514,120 A | 5/1996 | Johnston | |
| 5,716,009 A | 2/1998 | Ogihara | |
| 5,845,375 A | 12/1998 | Miller | |
| 6,102,299 A | 8/2000 | Pace | |
| 6,132,660 A | 10/2000 | Kampfer | |
| 6,237,569 B1 | 5/2001 | Stelzer | |
| 6,387,981 B1 | 5/2002 | Zhang | |
| 6,572,693 B1 | 6/2003 | Wu | |
| 6,678,955 B2 * | 1/2004 | Takeshita | F02M 51/0678 239/533.11 |
| 6,764,924 B2 | 7/2004 | Gmür | |
| 6,845,748 B2 * | 1/2005 | Kobayashi | F02M 51/0671 123/305 |
| 6,899,948 B2 | 5/2005 | Zhang | |
| 7,125,510 B2 | 10/2006 | Huang | |
| 7,297,374 B1 | 11/2007 | Arney | |
| 7,393,882 B2 | 7/2008 | Wu | |
| 7,582,685 B2 | 9/2009 | Arney | |
| 7,804,649 B2 * | 9/2010 | Eckhardt | G02B 3/0031 359/619 |
| 8,447,157 B2 | 5/2013 | Carpenter | |
| 8,720,047 B2 * | 5/2014 | Hulseman | B23H 1/06 264/224 |
| 8,814,954 B2 * | 8/2014 | Hulseman | B23H 9/00 228/183 |
| 9,333,598 B2 * | 5/2016 | Carpenter | B23P 15/16 |
| 2007/0000128 A1 | 1/2007 | Chung | |
| 2009/0099537 A1 | 4/2009 | DeVoe | |
| 2009/0308953 A1 | 12/2009 | Palestrant | |
| 2012/0126038 A1 | 5/2012 | Carpenter | |
| 2013/0149488 A1 | 6/2013 | Chandrasekaran | |
| 2013/0313339 A1 | 11/2013 | Carpenter | |
| 2014/0050883 A1 | 2/2014 | Hanschen | |

FOREIGN PATENT DOCUMENTS

| | | | |
|---|---|---|---|
| JP | 2001179136 A | | 7/2001 |
| JP | 2002115627 A | | 4/2002 |
| JP | 2005250021 A | * | 9/2005 |
| JP | 2005305971 A2 | | 11/2005 |
| JP | 2006002720 A | | 1/2006 |
| JP | 2010269480 A2 | | 12/2010 |
| WO | WO 2009-067308 | | 5/2009 |
| WO | WO 2011/014607 | | 2/2011 |
| WO | WO 2011-014607 | | 2/2011 |
| WO | WO 2012-106512 | | 8/2012 |
| WO | WO 2014-022646 | | 2/2014 |

OTHER PUBLICATIONS

Fenske, "Fabrication of Small Diesel Fuel Injector Orifices", Feb. 25, 2008, URL<http://www1.eere.energy.gov/vehiclesandfuels/pdfs/merit_review_2008/propulsionmaterials/merit08_fenske.pdf>, 16 pages.
Fenske, "Fuel injector Holes", (Fabrication of Micro-Orifices for Fuel Injectors, URL <http://www1.eere.energy.gov/vehiclesandfuels/pdfs/merit_review_2010/propulsion_materials/pm003_fenske_2010_o.pdf>, Jun. 10, 2010, 20 pages.
Fenske, "Fuel injector Holes", (Fabrication of Micro-Orifices for Fuel Injectors, URL <http://www1.eere.energy.gov/vehiclesandfuels/pdfs/merit_review_2009/propulsion_materials/pm_03_fenske.pdf>, May 21, 2009, 23 pages.
Huan, "Analysis of Radiative Heat Transfer in Three-Dimensional Absorbing, Emitting, and Scattering Media—A source function Approach", 59-66 (1990).
Karnakis, "Laser Microdrilling in Industrial Applications", 2004, <http://www.designforlasermanufacture.com/assets/OLmicrodrill.pdf>, 40 Pages.
Rakowski, "Non-traditional methods for making small holes", Modern machine Shop, Jun. 2002, 7 pages.
International Search Report for PCT International Application No. PCT/US2012/063066 dated May 13, 2013, 3 pages.

* cited by examiner

METHOD OF MAKING A NOZZLE

CROSS REFERENCE TO RELATED APPLICATIONS

This application is a national stage filing under 35 U.S.C. 371 of PCT/US2012/063066, filed Nov. 1, 2012, which claims priority to U.S. Provisional Application No. 61/554,561, filed Nov. 2, 2011, the disclosures of which are incorporated by reference in their entireties herein.

FIELD

The present description relates to methods of making nozzles. Specifically, the present description relates to methods of making nozzles that may be used as components of a fuel injection system.

SUMMARY OF THE INVENTION

In one aspect, the present description relates to a method of fabricating a nozzle. The method involves a number of steps, including a first step of casting and curing a first material in order to form a first microstructured pattern in the first material. The first microstructured pattern includes a plurality of discrete microstructures. The casting and curing step may involve casting a first material in a first cast, curing the first material, and removing the material from the first cast. The method further involves replicating the first microstructured pattern in a second material different than the first material to make a replicated structure. Next, the second material of the replicated structure is planarized to expose tops of the microstructures in the plurality of microstructures in the first microstructured pattern. The method then includes removing the first material resulting in a nozzle having a plurality of holes in the second material and corresponding to the plurality of microstructures in the first microstructured pattern.

In another aspect, the present description relates to another method of fabricating a nozzle. The method includes the first step of extruding a first material in order to form a first microstructured pattern in the first material. The first microstructured pattern includes a plurality of discrete microstructures. The method further involves replicating the first microstructured pattern in a second material different than the first material to make a replicated structure. Next, the second material of the replicated structure is planarized to expose tops of the microstructures in the plurality of microstructures in the first microstructured pattern. The method then includes removing the first material resulting in a nozzle having a plurality of holes in the second material and corresponding to the plurality of microstructures in the first microstructured pattern.

DETAILED DESCRIPTION

Fuel injection is increasingly becoming the preferred method for mixing fuel and air in internal combustion engines, as fuel injection generally can be used to increase fuel efficiency of the engine and reduces hazardous emissions. Fuel injectors generally include a nozzle with a plurality of nozzle through-holes for atomizing the fuel under pressure for combustion. Increasingly stringent environmental standards require more efficient fuel injectors. The search for more efficient fuel injectors has led to investigation of a number of varying sizes and shapes of fuel injector nozzles, such as those described in commonly owned and assigned PCT Application No. US2010/043628 (internal Matter ID 65658WO003), the entirety of which is incorporated by reference herein in its entirety. In addition to the search for optimally sized and shaped fuel injector nozzles, has come the search for new methods of creating highly effective nozzles. One such method begins with structurization using a use of two-photon process described in PCT Application No. US2010/043628, described above. The present description relates to other new and effective methods of providing nozzles for use in high efficiency fuel injectors.

The term "nozzle" will be used throughout this description. It should be understood that the term "nozzle" may have a number of different meanings in the art. In some specific references, the term nozzle has a broad definition. For example, U.S. Patent Publication No. 2009/0308953 A1 (Palestrant et al.), discloses an "atomizing nozzle" which includes a number of elements, including an occluder chamber 50. This differs from the understanding and definition of nozzle put forth herewith. For example, the nozzle of the current description would correspond generally to the orifice insert 24 of Palestrant et al. In general, the nozzle of the current description can be understood as the final tapered portion of an atomizing spray system from which the spray is ultimately emitted, see e.g., Merriam Webster's dictionary definition of nozzle ("a short tube with a taper or constriction used (as on a hose) to speed up or direct a flow of fluid." Further understanding may be gained by reference to U.S. Pat. No. 5,716,009 (Ogihara et al.) issued to Nippondenso Co., Ltd, (Kariya, Japan). In this reference, again, fluid injection "nozzle" is defined broadly as the multi-piece valve element 10 ("fuel injection valve 10 acting as fluid injection nozzle . . . "—see col. 4, lines 26-27 of Ogihara al.). The current definition and understanding of the term "nozzle" as used herein would relate to first and second orifice plates 130 and 132 and potentially sleeve 138 (see FIGS. 14 and 15 of Ogihara et al.), for example, which are located immediately proximate the fuel spray. A similar understanding of the term "nozzle" to that described herein is used in U.S. Pat. No. 5,127,156 (Yokoyama et al.) to Hitachi, Ltd. (Ibaraki, Japan). There, the nozzle 10 is defined separately from elements of the attached and integrated structure, such as "swirler" 12 (see FIG. 1(II)). The above-defined understanding should be understood when the term "nozzle" is referred to throughout the remainder of the description and claims.

Figure 1A:
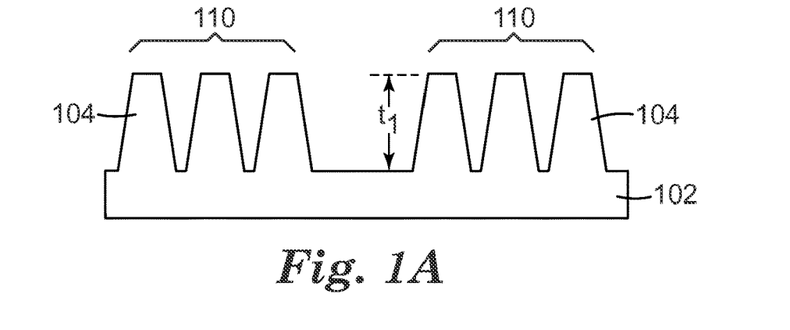
FIGS. 1A-1E combine to create a flow chart of a method of fabricating a nozzle according to the present description.
Figure 1B:
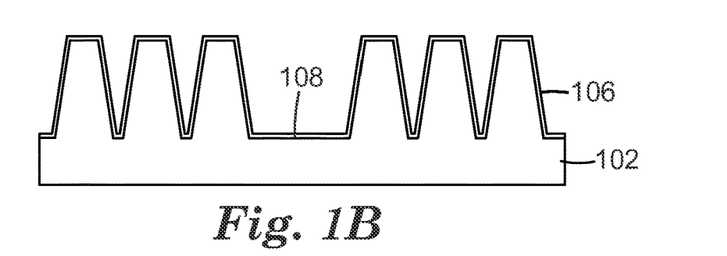

FIGS. 1A-1E provide a flow chart of one embodiment of a method for fabricating a nozzle according to the present description. FIG. 1A illustrates providing a first microstructured pattern 110 in a first material 102. The first microstructured pattern 110 includes a plurality of discrete microstructures 104. Discrete microstructures have a height $t_1$. In this first embodiment the first microstructured pattern is formed by a cast and cure process. A simplified diagram of one such process is illustrated in FIG. 2A. A cast 200 with a negative of microstructure pattern 110 is provided. A given volume of curable material, in many cases a polymer, is cast into cast 200. In some cases, the polymer may be a silicone, acrylic, rubber, or fluoropolymer. Once the first uncured material 100 has been cast into cast 200, it is cured by an appropriate method. For example, in some embodiments, the first material 100 may be cured by thermal curing, or potentially exposure to UV radiation. Other appropriate curing methods known in the art, such as applying other forms of radiation, may also be used. Once curing has occurred, the first microstructured material 102 may then be removed from mold 200 as shown in FIG. 2B. First microstructured material 102 will contain microstructures 104 arranged in a first microstructured pattern 110. Typically, the mold and the cured first microstructured material are separated physically (i.e., by carefully pulling them apart without damaging the mold and/or the cured first microstructured material). Separation may be accomplished manually or via the use of suitable tools such as tweezers etc. The result of these steps may provide for the microstructured material 102 of FIG. 1A.

Figure 3:
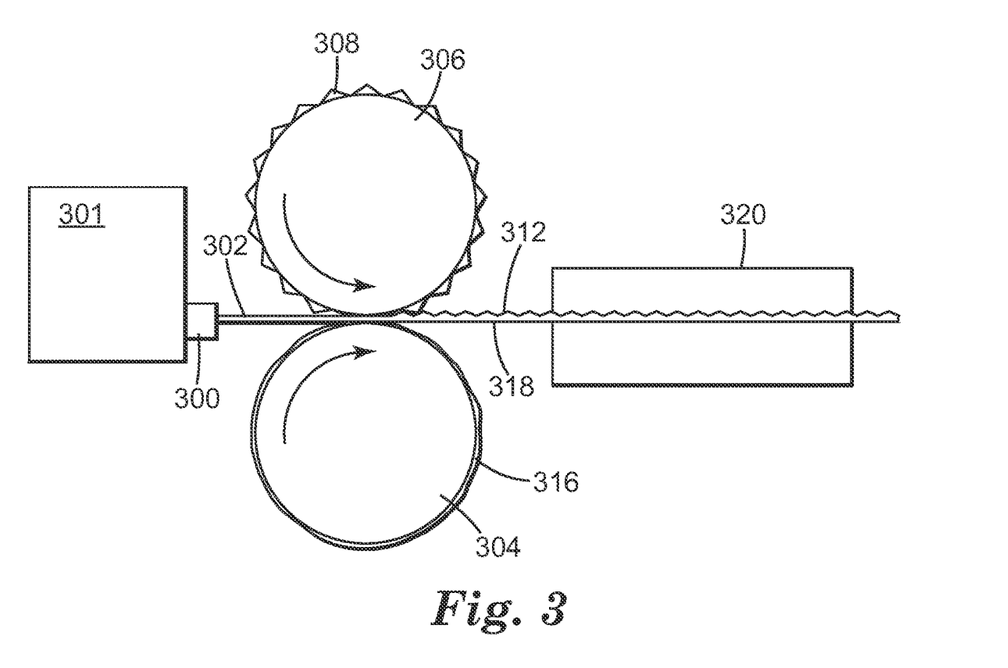
FIG. 3 is a diagram of an apparatus used to produce a microstructured film by extrusion.

In another embodiment, the first material 102 of FIG. 1A having first microstructured pattern 110, may be created by an extrusion process. A close up view of exactly how the extrusion process may operate is illustrated in FIG. 3. A film may be cast between a pair of rollers that are spaced apart by a specific dimension, as is illustrated in FIG. 3, where a film 302 is pulled from a reservoir 301, through a die 300 by an extrusion roller 304. The film 302 is nipped between the extrusion roller 304 and a second roller 306. Where the film 302 has a surface structure, the second roller 306 may be a pattern roller, provided with a prescribed surface for embossing a pattern onto the film 302. For example, where the film 302 is being manufactured as a prismatic film, the second roller 306 is provided with a plurality of prismatic structures 308 around its surface, which create complementary impressions in the upper surface 312 of the film 302. The pattern roller may have a diameter whose value lies in the range 15 cm-60 cm. The extrusion roller 304 may also be provided with an embossing pattern that is used to emboss a pattern onto the lower surface 318 of the film. After passing between the rollers 304 and 306, the film 302 cools, for example in a cooler 320, and maintains the patterns embossed on it by the rollers 304 and 306. In the particular embodiment shown, the extrusion roller 304 has a surface 316 that has random variations in height on the lower surface of the film 318.

The upper roller 306 may be provided with many different types of embossing patterns. Examples of embossing patterns that may be used on the upper roller 306 include a prismatic pattern that may correspond to, e.g., a brightness enhancement film, a lenticular pattern for a lenticular film, a hemispheric pattern, and the like. In addition, the prismatic structures on the upper roller 306 may be arranged in a direction perpendicular to the direction of rotation, around the circumference of the roller 306, rather than in a direction parallel to the direction of rotation, as shown in FIG. 3. The upper roller 306 may also be smooth to provide a flat film surface, or may be provided with a surface for embossing a pattern on the upper surface 312 of the film 302. The surface of the extrusion roller 304 may potentially include an irregular embossing pattern. After forming the plurality of microstructures on surface 312, the sheet may be cut into more manageable sized pieces and may serve as the first material 102 having first microstructured pattern 110 in FIG. 1A.

Besides prismatic or hemispheric shaped microstructures, a number of other commercially available products with varying microstructure patterns and shapes may be appropriate. For example, the discrete microstructures 104 may be shaped such as re-closeable fasteners with posts or mushroom-shaped tops. These structures may be made by the processes shown in commonly owned and assigned U.S. Pat. Nos. 5,845,375 and 6,132,660, which are incorporated by reference herein.

Other approaches may be utilized to produce a film having one or more structured surfaces, including embossing a sheet, injection molding and compression molding. In one particular approach, a film of embossable material, applied to a web, is compressively held against a pattern surface to emboss the complement of the pattern surface onto the film. The embossable material may be a thermoplastic material, such as poly(ethylene teraphthalate), polyamides such as nylon, poly(styrene-acrylonitrile), poly(acrylonitrile-butadiene-styrene), polyolefins such as polypropylene, and plasticized polyvinyl alcohol. In such embodiments, the film may be cooled while being held against the patterned surface in order to solidify the material with the pattern embossed thereon. In a variation of this approach, the embossable material may be a curable polymer that is cured, or partially cured before the patterned surface is removed.

As mentioned above, the first material 102 of FIG. 1A may be an appropriate polymer, such as a silicone, acrylic, rubber or fluoropolymer. In another sense, the first material 102 may be understood as a hardcoat composition formed from the reaction product of a polymerizable composition. As such, at times throughout this description, the first material may be described as a "hardcoat." Specifically, the first material 102 may be a hardcoat composition formed from the reaction product of a polymerizable composition comprising one or more urethane(meth)acrylate oligomer(s). Typically, the urethane(meth)acrylate oligomer is a di(meth)acrylate. The term "(meth)acrylate" is used to designate esters of acrylic and methacrylic acids, and "di(meth)acrylate" designates a molecule containing two (meth)acrylate groups.

Oligomeric urethane (meth)acrylates may be obtained commercially; e.g., from Sartomer under the trade designation "CN 900 Series", such as "CN981" and "CN981B88. Oligomeric urethane(meth)acrylates are also available from Cytec Industries Inc. (Woodland Park, N.J.) and Cognis (Monheim am Rhein, Germany). Oligomeric urethane (meth)acrylates may also be prepared by the initial reaction of an alkylene or aromatic diisocyanate of the formula OCN—$R^3$—NCO with a polyol. Most often, the polyol is a diol of the formula HO—$R^4$—OH, wherein $R^3$ is a $C_{2-100}$ alkylene or an arylene group and $R^4$ is a $C_{2-100}$ alkylene alkoxy group. The intermediate product is then a urethane diol diisocyanate, which subsequently can undergo reaction with a hydroxyalkyl(meth)acrylate. Suitable diisocyanates include alkylene diisocyanates such as 2,2,4-trimethylhexylene diisocyanate. The urethane(meth)acrylate oligomer employed herein is preferably aliphatic.

The urethane(meth)acrylate oligomer contributes to the conformability and flexibility of the cured hardcoat composition. In preferred embodiments, a 5 micron thick film of the cured hardcoat composition is sufficiently flexible such that it can be bunt around a 2 mm mandrel without cracking.

In addition to being flexible, the hardcoat has good durability and abrasion resistance. For example, a 250 micrometer (5 mil) thick film of the cured hardcoat exhibits a change in haze of less than 10% after commonly used oscillating sand abrasion testing.

The kind and amount of urethane(meth)acrylate oligomer is selected in order to obtain a synergistic balance of flexibility and good abrasion resistance.

One suitable urethane(meth)acrylate oligomer that can be employed in the hardcoat composition is available from Sartomer Company (Exton, Pa.) under the trade designation "CN981B88". This particular material is an aliphatic urethane(meth)acrylate oligomer available under the trade designation CN981 blended with SR238 (1,6 hexanediol diacrylate). Other suitable urethane (meth)acrylate oligomers are available from Sartomer Company under the trade designations "CN9001" and "CN991". The physical properties of these aliphatic urethane (meth)acrylate oligomers, as reported by the supplier, are set forth in Table 1 as follows:

TABLE 1

Physical Properties of Aliphatic Urethane Meth(Acrylate) Oligomers

| Trade Designation | Viscosity Cps at 60° C. | Tensile Strength (MPa) | Elongation (%) | Tg (° C.) as determined by DSC |
|---|---|---|---|---|
| CN981 | 6190 | 7.67 | 81 | 22 |
| CN981B88 | 1520 | 10.48 | 41 | 28 |
| CN9001 | 46,500 | 22.72 | 143 | 60 |
| CN991 | 660 | 37.08 | 79 | 27 |

The reported tensile strength, elongation, and glass transition temperature (Tg) properties are based on a homopolymer prepared from such urethane (meth)acrylate oligomer. These embodied urethane(meth)acrylate oligomers can be characterized as having an elongation of at least 20% and typically no greater than 200%; a Tg ranging from about 0 to 70° C.; and a tensile strength of at least 6.89 MPa (1,000 psi), or at least 34.48 MPa (5,000 psi).

These embodied urethane(meth)acrylate oligomers and other urethane(meth)acrylate oligomers having similar physical properties that can usefully be employed at concentrations ranging from at least 25 wt-%, 26 wt-%, 27 wt-%, 28 wt-%, 29 wt-%, or 30 wt-% based on wt-% solids of the hardcoat composition. When the hardcoat composition further includes inorganic nanoparticles such as silica, the total concentration of the urethane(meth)acrylate oligomer is typically higher, ranging from about 40 wt-% to about 75 wt-%. The concentration of urethane(meth)acrylate oligomer can be adjusted based on the physical properties of the urethane(meth)acrylate oligomer selected.

The urethane(meth)acrylate oligomer is combined with at least one multi(meth)acrylate monomer comprising three or four (meth)acrylate groups. The multi(meth)acrylate monomer increases the crosslinking density and thereby predominantly contributes the durability and abrasion resistance to the cured hardcoat.

Suitable tri(meth)acryl containing compounds include glycerol triacrylate, trimethylolpropane triacrylate, ethoxylated triacrylates (for example, ethoxylated (3) trimethylolpropane triacrylate, ethoxylated (6) trimethylolpropane triacrylate, ethoxylated (9) trimethylolpropane triacrylate, ethoxylated (20) trimethylolpropane triacrylate), pentaerythritol triacrylate, propoxylated triacrylates (for example, propoxylated (3) glyceryl triacrylate, propoxylated (5.5) glyceryl triacrylate, propoxylated (3) trimethylolpropane triacrylate, propoxylated (6) trimethylolpropane triacrylate), trimethylolpropane triacrylate, pentaerythritol triacrylate, and tris(2-hydroxyethyl)isocyanurate triacrylate.

Higher functionality (meth)acryl containing compounds include ditrimethylolpropane tetraacrylate, ethoxylated (4) pentaerythritol tetraacrylate, and pentaerythritol tetraacrylate.

Commercially available cross-linkable acrylate monomers include those available from Sartomer Company (Exton, Pa.) such as trimethylolpropane triacrylate available under the trade designation SR351, pentaerythritol triacrylate available under the trade designation SR444. dipentaerythritol triacrylate available under the trade designation SR399LV, ethoxylated (3) trimethylolpropane triacrylate available under the trade designation SR454, ethoxylated (4) pentaerythritol triacrylate, available under the trade designation SR494, and tris(2-hydroxyethyl)isocyanurate triacrylate, available under the trade designation SR368.

The hardcoat may additionally comprise one or more di(meth)acryl containing compounds. For example, the urethane(meth)acrylate oligomer may be purchased preblended with a di(meth)acrylate monomer such as in the case of CN988B88. Suitable monomers include, for example, 1,3-butylene glycol diacrylate, 1,4-butanediol diacrylate, 1,6-hexanediol, diacrylate, 1,6-hexanediol monoacrylate monomethacrylate, ethylene glycol diacrylate, alkoxylated aliphatic diacrylate, alkoxylated cyclohexane dimethanol diacrylate, alkoxylated hexanediol diacrylate, alkoxylated neopentyl glycol diacrylate, caprolactone modified neopentylglycol hydroxypivalate diacrylate, caprolactone modified neopentylglycol hydroxypivalate diacrylate, cyclohexanedimethanol diacrylate, diethylene glycol diacrylate, dipropylene glycol diacrylate, ethoxylated (10) bisphenol A diacrylate, ethoxylated (3) bisphenol A diacrylate, ethoxylated (30) bisphenol A diacrylate, ethoxylated (4) bisphenol. A diacrylate, hydroxypivalaldehyde modified trimethylolpropane diacrylate, neopentyl glycol diacrylate, polyethylene glycol (200) diacrylate, polyethylene glycol (400) diacrylate, polyethylene glycol (600) diacrylate, propoxylated neopentyl glycol diacrylate, tetraethylene glycol diacrylate. tricyclodecanedimethanol diacrylate, triethylene glycol diacrylate, and tripropylene glycol diacrylate.

Returning to FIG. 1A, once the first microstructured pattern has been formed in first material 102 by either cast and cure method of FIGS. 2A-B or the extrusion method shown in FIG. 3 using the materials discussed above, the first microstructured pattern 110 is replicated. Looking at FIG. 1B, first, an optional seed layer 106 may be applied on the microstructured surface. The top surface 108 of first material 102 is metalized or made electrically conductive by coating the top surface with a thin electrically conductive seed layer 106 similar to seed layer.

Conductive seed layer 106 can include any electrically conductive material that is desirable in an application. Exemplary conductive materials include silver, chromium, gold and titanium as well as conductive polymers such as polyacetylene, polyphenylene vinylene, poly aniline, polythiphene and the like. In some cases, seed layer 106 has a thickness that is less than about 100 nm, less than about 50 nm, or less than about 40 nm, or less than about 30 nm, or less than about 20 nm.

Figure 1C:
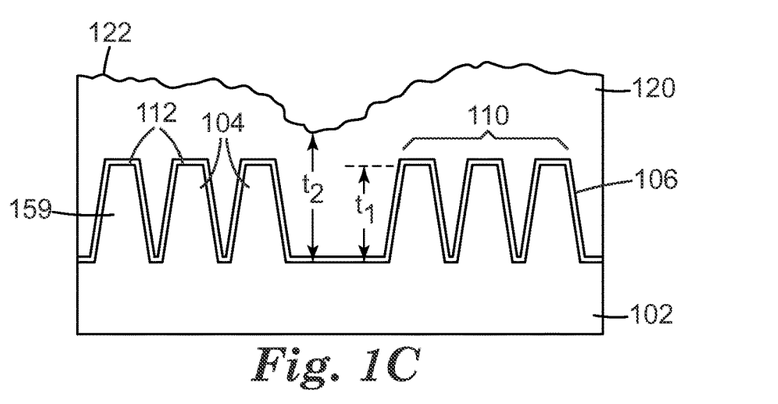
Figure 2A:
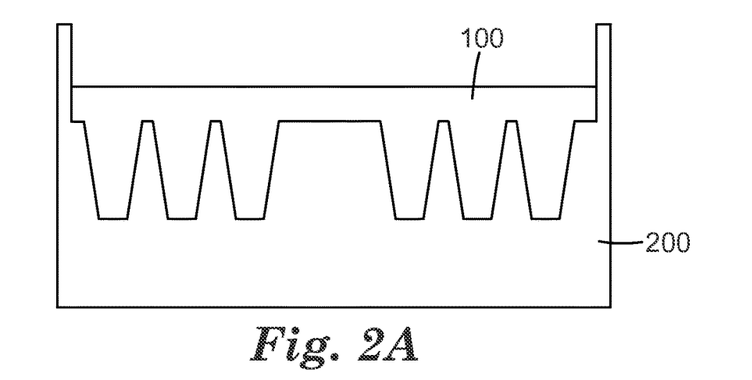
FIGS. 2A-2B illustrate an initial cast and cure step.
Figure 2B:
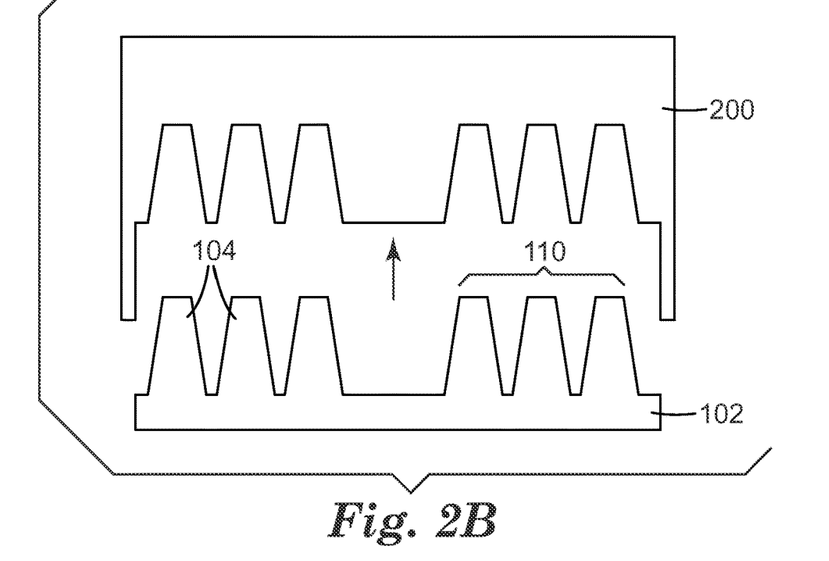

Next, as schematically illustrated in FIG. 1C, seed layer 106 is used to electroplate first microstructured pattern with a second material different than the first material resulting in a layer 120 of the second material. In some cases, the electroplating of first microstructured pattern 110 is continued until the minimum thickness $t_2$ of layer 120 is greater than $t_1$, the height of the microstructures 104 and, thereby, form blind holes in the layer 120 with the microstructures 104. In some cases, height $t_2$ is substantially equal to height $t_1$. Suitable second materials for electroplating include silver, passivated silver, gold, rhodium, aluminum, enhanced reflectivity aluminum, copper, indium, nickel, chromium, tin, and alloys thereof. In other embodiments, the second material may be a ceramic that is deposited on first microstructured pattern. Such a ceramic material may be formed, e.g., by a sol-gel process as described in commonly owned and assigned U.S. Pat. No. 5,453,104, or by photocuring of a ceramic-filled or pre-ceramic polymeric composition as described in commonly owned and assigned U.S. Pat. Nos. 6,572,693, 6,387,981, 6,899,948, 7,393,882, 7,297,374, and 7,582,685, each of which is herein incorporated by reference in its entirety. Such ceramic materials may comprise, e.g., silica, zirconia, alumina, titania, or oxides of yttrium, strontium, barium, hafnium, niobium, tantalum, tungsten, bismuth, molybdenum, tin, zinc, lanthanide elements (i.e. elements having atomic numbers ranging from 57 to 71, inclusive), cerium and combinations thereof.

Figure 1D:
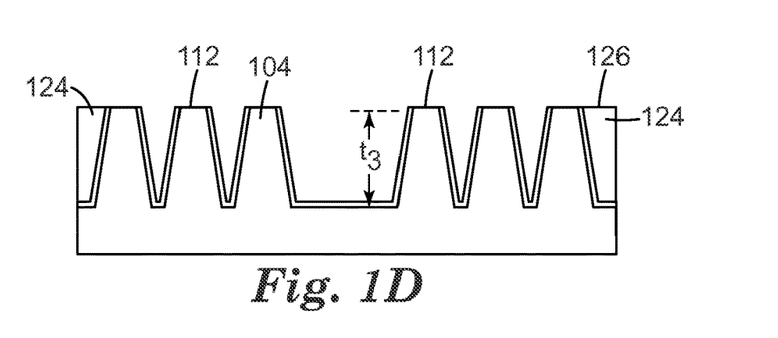

Next, top surface of 122 of layer 120 is ground until tops 112 of microstructures 104 are exposed. The grinding or polishing can be accomplished using any grinding method that may be desirable in an application. Exemplary grinding methods include surface grinding and mechanical milling. In some cases, the first material is softer than the second material. For example, in some cases, the first material is polycarbonate and the second material is a nickel alloy. In such cases, small portions of tops 112 can be removed during the grinding process to ensure that the tops of all the microstructures in first microstructured pattern 110 are exposed. In such cases, the grinding results, as schematically illustrated in FIG. 1D, in a layer 124 of the second material plagiarizing the first microstructured pattern and exposing tops 112 of the microstructures in the plurality of microstructures in the first microstructured pattern. Layer 124 of the second material has a top surface 126 that is substantially even with tops 112 of microstructures 104. The microstructures have a height $t_3$ that can be slightly less than $t_1$.

Although in FIGS. 1A-1D, the microstructures 104 are illustrated as having flattened tops initially, this need not be the case. In a number of embodiments the microstructures in the initial step may have a peaked surface. This may be especially appropriate as this portion of the microstructure may act as a sacrificial portion that aids in providing optimal planarization during the grinding step. A better understanding of this concept may be understood by reference to commonly owned and assigned U.S. Provisional Patent Application No. 61/438,848 (internal Matter Number 67266US002), incorporated herein by reference in its entirety.

Figure 1E:
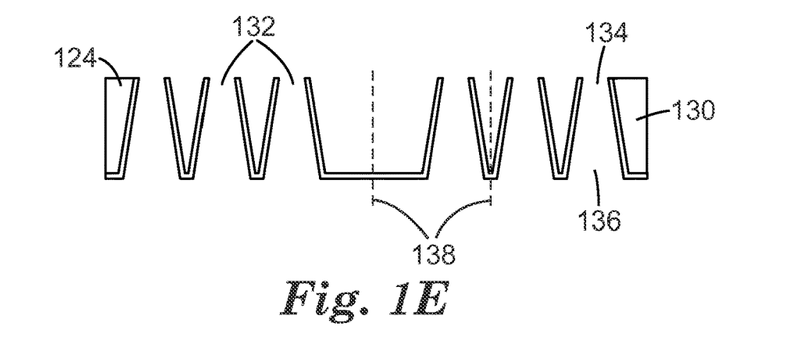

Next, as illustrated in FIG. 1E, first material 104 is removed, resulting in a layer 130 of the second material that includes a plurality of through-holes 132 that correspond to the plurality of microstructures in first microstructured pattern 110. Holes 130 include hole entries 136 and hole exits 134. The layer 130 made up of second material and may be any of the appropriate metals mentioned above, e.g. nickel, or may be, for example, ceramic. Optionally, the individual microstructures, each bearing a hole entry 136 and hole exit 134 may be singulated by dividing them from one another along, e.g., lines 138. The individual microstructures may then potentially be recombined in a desired pattern by an appropriate means, such as laser welding. In other embodiments, the microstructured pattern will be cast and cured or go through the extrusion process such that the final pattern matches that of the first material's first microstructured pattern.

Typically, the first material and the second material that includes plurality of holes are separated physically (i.e., by carefully pulling them apart without damaging the mold and/or the cured first microstructured material. Separation may be accomplished manually or via the use of suitable tools such as tweezers etc. It is also possible to remove the first material chemically, for example, by dissolving the first material in a suitable solvent such as acetone, ethyl alcohol, isopropyl alcohol or the like. Alternately one may use an etchant such as an aqueous solution of KOH. The first material and the second material may also be separated thermally by melting or burning of the first material at a suitable temperature without deforming, melting or otherwise damaging the second material.

In some cases, the plurality of discrete microstructures formed includes a discrete microstructure that is a three-dimensional rectilinear body, a portion of a three-dimensional rectilinear body, a three-dimensional curvilinear body, a portion of a three-dimensional curvilinear body, a polyhedron, a cone, or a tapered microstructure.

Figure 4:
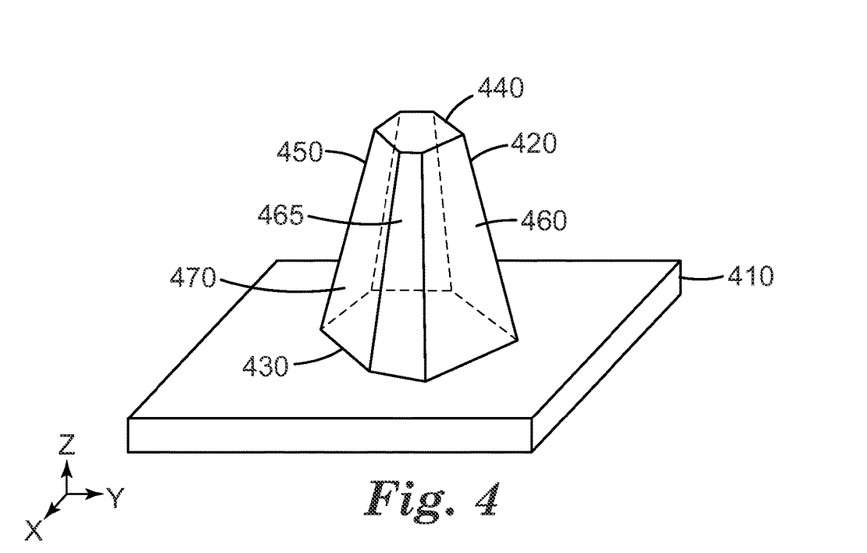
FIG. 4 is a schematic three-dimensional view of a microstructure.

In some cases, a disclosed microstructure can be a three-dimensional rectilinear body such as a polyhedron, such as a tetrahedron or a hexahedron, a prism, or a pyramid, or a portion, or a combination, of such bodies, such as a frustum. For example, FIG. 4 is a schematic three-dimensional view of a microstructure 420 that is disposed on a substrate 410 and includes a planar or flat base 430, a planar or flat top 440 and a side 450 that connects the top to the base. Side 450 includes a plurality of planar or flat facets, such as facets 460, 465 and 470. Microstructure 420 can be used as a mold to fabricate holes for use in, for example, a nozzle.

Figure 5:
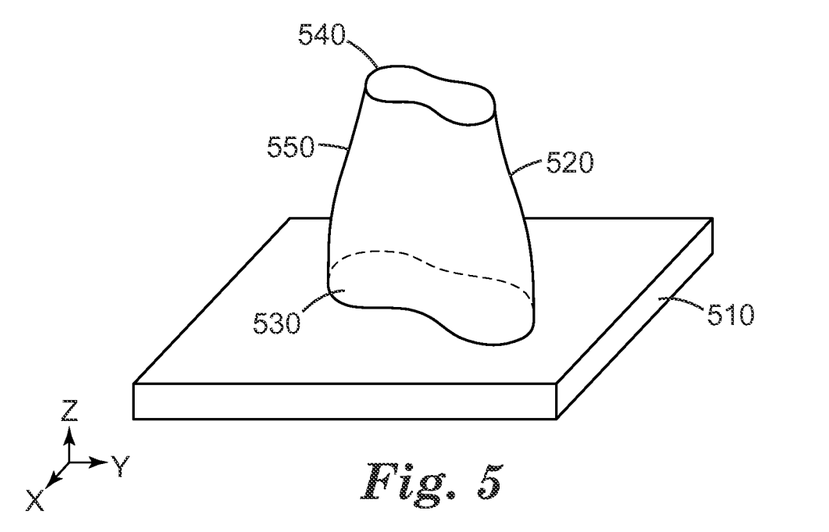
FIG. 5 is a schematic three-dimensional view of a microstructure.

In some cases, a disclosed microstructure can be a three-dimensional curvilinear body or a portion of such body, such as a segment of a sphere, an asphere, an ellipsoid, a spheroid, a paraboloid, a cone or a truncated cone, or a cylinder. For example, FIG. 5 is a schematic three-dimensional view of a microstructure 520 that is disposed on a substrate 510 and includes a planar or flat base 530, a planar or flat top 540 and a curvilinear side 550 that connects the top to the base. In the exemplary microstructure 520, top 540 and base 530 have the same shape. Microstructure 520 tapers narrower from base 530 to top 540. As a result, top 540 has a smaller area than base 530. Microstructure 520 can be used as a mold to fabricate holes for use in, for example, a nozzle.

Figure 6:
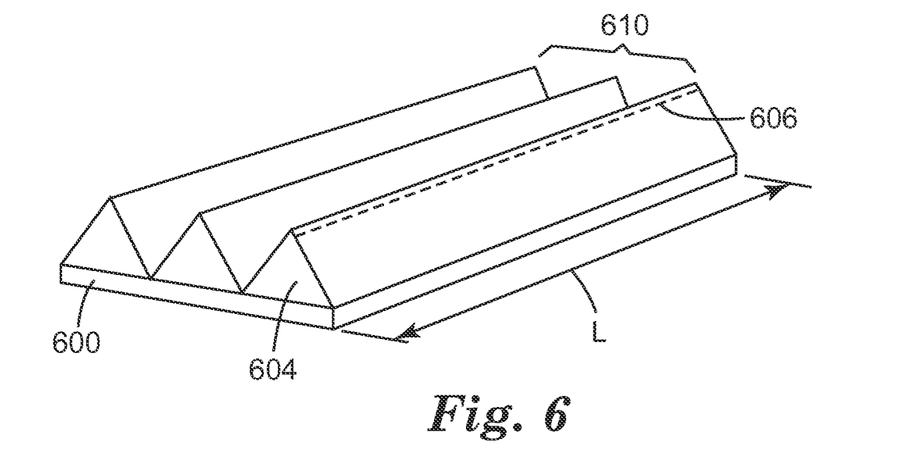
FIG. 6 is a perspective view of a film with a plurality of microstructures.

In other cases, such as that shown in FIG. 6, the microstructured pattern 610 of film 600 may contain a plurality of microstructures 604 that are elongated. For example, as shown in FIG. 6, the microstructures may be prisms that are elongated along the length of the film L. In such a case once the tops of the microstructures are ground, the opening corresponding to the hole outlet may in fact be an elongated slit, such as where the tops of the elongated prism is removed along dashed line 606.

The microstructures of the current description may be understood as having a "diameter" of their opening at different heights of the microstructure. The diameter may be, understood as the maximum distance between the edges of the microstructure at a common height. In some embodiments the hole entry may have a diameter of less than 300 microns, or of less than 200 microns, or of less than or equal to 160 microns, or of less than 140 microns. In some embodiments the hole exit may have a diameter of less than 300 microns, or less than 200 microns, or less than 100 microns, or less than or equal to 40 microns, or less than 25 microns. As shown in the Figures, the microstructures disclosed herein that serve as nozzles may be monolithic structures. In other words, the microstructures that form the actual nozzles are created from, and ultimately form a common, single piece of material. This may be understood as different from nozzles that are formed through a combination of a number of different parts, where such parts are potentially made up of different materials. In this regard, as shown in the above-mentioned figures, the nozzles disclosed herein may be monolithic structures.

In some cases, a microstructure can be intentionally deformed (i.e., bent, twisted etc.). Such deformation can be used to affect the flow of fluids thorough the nozzles made using these microstructures. More specifically, by deforming the microstructures, the resulting nozzles may direct the flow of fluids in a desired direction or may lead to a desired angular/volumetric distribution of the fluids in the combustion chamber. Such deformation of the microstructures may be accomplished by thermal means, mechanical means or thermomechanical means. For example, the microstructured first material may be heated to soften and potentially even partially melt the microstructures causing them to deform under the influence of gravity or other mechanical forces, in another embodiment, the microstructures are physically bent by the action of a mechanical force on them at an angle. Some examples of potential applications of mechanical force include squeezing the microstructures between the mandrels of a vice or forcing them through a gap narrower than the height of the microstructures. In yet another embodiment, microstructures in the form of microposts may be contacted by a force applied along a plane orthogonal to the height of the structures, where the force acts downward (in the direction of the height of the microstructures. This force applied along the tops of the microstructures may be applied with a hot object at a temperature above the melting point of the first material, resulting in the melting the tips of the microposts and forming mushroom shaped microstructures. When the nozzles are made from the mushroom shaped microstructures by the method of the invention, the tops of the mushroom shaped microstructures lead to large cavities at the inlet side of the resulting nozzles. Such cavities may act as occlude chambers in a nozzle application.

In yet another embodiment, arrays of microstructures may be deformed. All or some of the individual microstructures in an array may be deformed. In some cases some of the microstructures are deformed in one pattern while others are deformed in a second pattern. It is possible to have each individual microstructure within the array be deformed in a predetermined relation to the neighboring microstructures.

EXAMPLES

Objectives and advantages of this invention are further illustrated by the following examples, but the particular materials and amounts thereof recited in these examples, as well as other conditions and details, should not be construed to unduly limit this invention. These examples are merely for illustrative purposes only and are not meant to be limiting on the scope of the appended claims. Unless otherwise noted, all chemicals were obtained from, or are available from chemical suppliers such as Sigma-Aldrich Chemical Company, St. Louis. Mo.

Example 1

A microstructured film was prepared by following the general method described in U.S. Pat. No. 5,845,375 (Miller et. al.). An ethylene-propylene copolymer (available from Dow Chemical Co. [Midland, Mich.] under the trade designation "C700-35N") resin was melted in a 45 millimeters twin screw extruder at a temperature of 230° C. and the extruded melt was passed through a die to form a film. The resulting film, being about 0.15 millimeters in thickness, and having a basis weight of 120 g/m$^{-2}$, was pressed against a microstructured tooling by feeding it through a pair of rollers. The microstructured tooling was mounted onto one of the rollers and chilled to about 90-120° C. (194-248° F.). The roller with the microstructured tooling was rotated at a surface speed of 0.33 m/s. The microstructure on the surface of the tooling comprised cavities (i.e., prismatic holes) of approximately 120 micrometer sides and 370 micrometer deep. The vacancies were arranged in a linear pattern along the x and y direction on the surface of the tooling approximately 520 micrometer apart. When the extruded film was pressed against the microstructured tooling by the action of the second roller, the pattern of microstructures was replicated in the extruded polypropylene film. The resulting polypropylene film (i.e. the replica) exiting the pair of rollers had posts (corresponding to the cavities on the surface of microstructured tooling) projecting from the film surface. The resulting microstructured film contained posts of approximately 120 micrometer sides and 370 micrometer depth. The vacancies were arranged in a linear pattern along the x and y direction on the surface of the tooling approximately 520 micrometer apart.

Next, the microstructured film was electroplated with Ni following the general electroplating processes well known in the art. A general description of the electroplating art can be found, for example, in "*Modern Electroplating*", *Fourth Edition*, 2002, John Wiley & Sons, editors: Mordechav Schlesinger and Milan Paunovic. A circular (about 3 millimeter in diameter) section of the microstructured film produced above was cut out and was adhered on a stainless steel disc with the aid of a double stick tape. The surface of the film was made conductive by depositing a thin Ag film (seed layer) on the microstructured film replicas by e-beam evaporation. The process of depositing thin layer of Ag is referred to as silver mirror reaction in the electroplating art. Nickel was electrodeposited on the Ag coated surface of the microstructured film to replicate the microstructures. Nickel electrodeposition was carried out in a nickel sulfamate bath at a pH range of 3.5-4.5 at a temperature of 54.5° C. The solution contained a 0.2% of sodium dodecyl sulfate surfactant. Nickel electrodeposition was carried out in four stages. In the first stage, which lasted approximately 6 hours, the current density was approximately 27 Amperes/m$^2$. The second stage lasted 4 hours and featured a current density of 54 Amperes/m$^2$, and the third stage lasted 4 hours and featured a current density of 108 Amperes/m$^2$. The fourth stage was 34 hours at a current density of 216 Amperes/m$^2$. Nickel electrodepositing was completed when the thickness of nickel reached about 500 micrometers.

Figure 7:
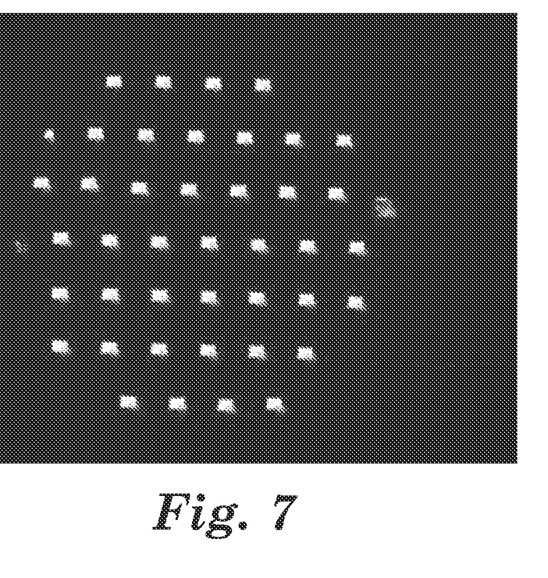
FIG. 7 is a backlit photomicrograph of a fuel injector nozzle produced according to Example 1.

After the electrodeposition was completed, the resulting nickel replica with the microstructured film still in place was planarized and fine-polished to remove enough material so that the holes in the nickel replica were open and free of burrs. This was accomplished by first attaching the Ni-plated microstructured film using a wax on a grinding fixture (with the microstructured film down) of a grinder/polisher (available from Ultra Tee Manufacturing, Inc. [Santa Ana, Calif.]). Extreme care was taken to ensure that the Ni-plated microstructured film was positioned parallel to the surface of grinding fixture. The fixture was mounted on the polisher and then the Ni-plated microstructured film was planarized and ground using 100, 150, and 220 grit size abrasive films, sequentially. The grinding continued until a sufficient amount of Ni was removed, exposing the tops of posts of the microstructured polymer. The level of grinding to be done was determined based on the desired opening size of the resulting nozzle. The Ni-plated microstructured film was then polished sequentially using 9, 6, and 3 micrometer diamond lapping films. Finally the microstructured film was separated from the polished (nickel) nozzle. The nozzle had square sided holes with approximately 120 micrometer sides. The nozzle holes were arranged in a linear pattern along the x and y direction on the surface of the tooling approximately 520 micrometer apart. A backlit photomicrograph of the nickel fuel injector nozzle of Example 1 in provided in FIG. 7.

Example 2

Example 2 was prepared in generally the same manner as Example 1. For Example 2, a low density polyethylene (LDPE) film was provided (about 580 micrometers in thickness, prepared from TENITE 18 DOA (obtained from Eastman Chemical Company [Kingsport, Tenn.] under trade designation "TENITE 18"), with 0.5% surfactant TRITON X100 (obtained from Dow Chemical Company [Midland, Mich.] under trade designation "TRITON X100") and minor quantities of $TiO_2$ pigment to make the film white in appearance. The general methods of making structured surfaces, and in particular microstructured surfaces, on a polymeric layer such as a polymeric film are disclosed in U.S. Pat. Nos. 5,069,403 and 5,133,516, both to Marentic et al., the relevant portions of which are hereby incorporated by reference. U.S. Pat. No. 5,514,120 to Johnston et al. describes how the tooling was created to microreplicate the V shaped film described herein. The microstructures on the surface of the tooling included linear, V-shaped groves running parallel to one another. The V-shaped groves had a height of 460 micrometers and 410 micrometer pitch. When the extruded film was pressed against the microstructured tooling by the action of the second roller, the microstructure was replicated in the extruded film. The resulting LDPE microstructured film (i.e. the replica) exiting the pair of rollers had V-shaped groves of same size as the microstructured tooling.

Next, the resulting microstructured film was electroplated with Ni, planarized and polished using the same process described above for Example 1.

Figure 8:
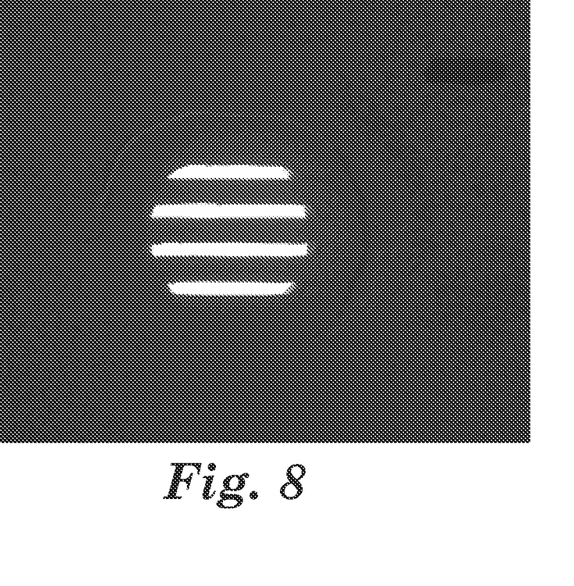
FIG. 8 is a backlit photomicrograph of a fuel injector nozzle produced according to Example 2.

The nozzle of Example 2 had rectangular openings. A backlit photomicrograph of the nickel fuel injector nozzle of Example 2 is provided in FIG. 8.

Example 3

Figure 9:
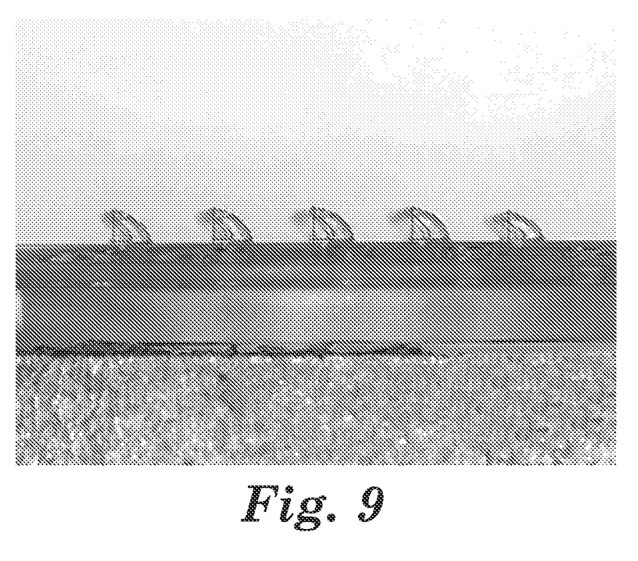
FIG. 9 is a photomicrograph of an array of microstructures according to Example 3.

In this example, hollow micro-needle arrays made of polycarbonate were used as the microstructured first material. The micro-needle arrays were prepared using the general processes described in commonly owned and assigned US Patent Publication No. US2009/009537 (DeVoe, et. al.). Each array had 18 micro-needles that were 900 micrometers tall and a tapered cone with a large, fixed end that was approximately 270 micrometers in diameter. The micro-needles were similar in shape to those shown in FIG. 10 of US Patent Publication No. US2009/009537 (DeVoe, et. al.). The conical shape made it easy to bend the needles near the top. The goal was to deform all of the micro-needle tips by bending them so that they "pointed" in an off-axis direction. The total height of the substrate plus the micro-needles was approximately 2.52 millimeter (0.099 inch). A gap between the smooth jaws of a miniature tooling vise was set to about 2.159 millimeters (0.085 inches). Once the gap was set, the polycarbonate micro-needle array was pressed by hand through the gap. All of the needles in the array were bent by a similar amount. FIG. 9 is a photomicrograph of the deformed micro-needle arrays illustrates the results of bending the micron-needles over. While in this Example 3, the vise jaws were set parallel to each other; they did not need to be parallel. A non-parallel gap in the cross-web direction would result in the needles on one side of the substrate being bent more than the needles on the other.

The deformed microneedle pre-form was then silver sputtered, nickel electro-plated and backside ground using exactly the same processes used in Example 1 above.

Example 4

Example 4 was prepared in generally the same manner as Example 3, except that the micro-needle arrays were deformed by pressing an aluminum cylindrical rod on the center of the micro-needle array. The deformed microneedles were bent at their tips so as to point outward from the center of the array in a circular arrangement.

The deformed microneedle pre-form was then silver sputtered, nickel electro-plated and backside ground using exactly the same processes used in Example 1 above.

The invention claimed is:

1. A method of fabricating a nozzle comprising the steps of:
   casting and curing a first material by nipping the first material between a first roller and a second roller provided with a patterned surface for forming a first microstructured pattern in the first material, with the first microstructured pattern comprising a plurality of discrete microstructures;
   deforming at least one of the plurality of discrete microstructures, resulting in at least one deformed discrete microstructure:
   replicating the first microstructured pattern, including the at least one deformed discrete microstructure, in a second material different than the first material to make a replicated structure comprising a plurality of blind holes formed in the second material;
   removing enough of the second material of the replicated structure to expose tops of the microstructures in the plurality of microstructures in the first microstructured pattern; and
   removing the first material from the replicated structure, resulting in a nozzle having a plurality of through-holes in the second material and corresponding to the plurality of micro structures in the first microstructured pattern.

2. The method of claim 1, wherein the first material has opposite surfaces, the first roller is provided with another patterned surface such that, during the nipping of the first material between the first roller and second roller, the first microstructured pattern is formed in one surface of the first material and a second mircrostructured pattern is formed in the opposite surface of the first material, with the second microstructured pattern comprising a plurality of discrete microstructures, and said method further comprises:

replicating the second microstructured pattern in a third material different than the first material to make another replicated structure comprising a plurality of blind holes formed in the third material;

removing enough of the third material of the other replicated structure to expose tops of the microstructures in the plurality of microstructures in the second microstructured pattern; and removing the first material resulting in another nozzle having a plurality of through-holes in the third material and corresponding to the plurality of microstructures in the second microstructured pattern.

3. The method of claim 2, wherein said removing enough of the third material comprises planarizing the third material of the other replicated structure.

4. The method of claim 1, wherein the first material comprises a polymeric material and the second material comprises an electroplated metal.

5. The method of claim 1, wherein the plurality of discrete microstructures comprises a discrete microstructure that is, or is at least a portion of, a three-dimensional rectilinear body or a three-dimensional curvilinear body.

6. The method of claim 1, further comprising applying an electrically conductive seed layer on the first material prior to the step of replicating in the second material.

7. The method of claim 1, wherein said deforming comprises deforming an array of the plurality of discrete microstructures, resulting in an array of deformed discrete microstructures.

8. The method of claim 1, wherein said deforming comprises bending or twisting, resulting in at least one bent or twisted discrete microstructure.

9. The method of claim 1, wherein said deforming occurs by mechanical, thermal or thermomechanical means.

10. The method of claim 1, wherein the first material is in the form of a film cast between the first roller and the second roller so that the first microstructured pattern is embossed onto a surface of the film by the patterned surface of the second roller.

11. The method of claim 1, wherein the first material comprises a polymeric material, the second material comprises a metal material, and the first material is in the form of a film cast between the first roller and the second roller so that the first microstructured pattern is embossed onto a surface of the film by the patterned surface.

12. The method of claim 1, wherein said removing enough of the second material comprises planarizing the second material of the replicated structure.

13. The method of claim 1, wherein the nozzle comprises a ceramic.

* * * * *

UNITED STATES PATENT AND TRADEMARK OFFICE
CERTIFICATE OF CORRECTION

PATENT NO. : 10,406,537 B2
APPLICATION NO. : 14/354669
DATED : September 10, 2019
INVENTOR(S) : Zhang et al.

Page 1 of 1

It is certified that error appears in the above-identified patent and that said Letters Patent is hereby corrected as shown below:

In the Specification

Column 4
Line 26, delete "teraphthalate)," and insert -- terephthalate), --, therefor.
Line 39, delete "hardocat" and insert -- hardcoat --, therefor.
Line 61, after "alkylene" insert -- or --.

Column 5
Line 5, delete "bunt" and insert -- bent --, therefor.

Column 6
Line 18, delete "SR444." and insert -- SR444, --, therefor.
Line 46, delete "diacrylate." and insert -- diacrylate, --, therefor.
Lines 63-64, delete "polythiphene" and insert -- polythiophene --, therefor.

Column 7
Line 41, delete "plagiarizing" and insert -- planarizing --, therefor.

Column 8
Line 64, delete "be," and insert -- be --, therefor.

Column 9
Line 29, delete "forces, in" and insert -- forces. In --, therefor.

In the Claims

Column 12
Line 66, In Claim 2, delete "mircrostructured" and insert -- microstructured --, therefor.

Signed and Sealed this
Tenth Day of December, 2019

Andrei Iancu
*Director of the United States Patent and Trademark Office*